United States Patent [19]
Mikami et al.

[11] Patent Number: 5,372,839
[45] Date of Patent: Dec. 13, 1994

[54] PROCESS FOR PREPARING AN ELECTROLUMINESCENT FILM

[75] Inventors: Akiyoshi Mikami, Yamatotakada; Koichi Tanaka, Nara; Kouji Taniguchi, Nara; Masaru Yoshida, Nara; Shigeo Nakajima, Nara, all of Japan

[73] Assignee: Sharp Kabushiki Kaisha, Osaka, Japan

[21] Appl. No.: 789,818

[22] Filed: Nov. 12, 1991

Related U.S. Application Data

[63] Continuation of Ser. No. 348,392, May 8, 1991, abandoned.

[30] Foreign Application Priority Data

May 13, 1988 [JP] Japan ................. 63-117943

[51] Int. Cl.$^5$ ............................................. B05D 5/12
[52] U.S. Cl. ........................................ 427/66; 427/69; 427/70; 427/314; 427/255; 427/255.2
[58] Field of Search ............ 427/66, 69, 70, 250, 427/255.2, 314, 255

[56] References Cited

U.S. PATENT DOCUMENTS

| | | | |
|---|---|---|---|
| 3,889,016 | 6/1975 | Vlasenko et al. | 427/66 |
| 4,496,610 | 1/1985 | Cattell et al. | 427/66 |
| 4,725,344 | 2/1988 | Yocom et al. | 427/66 |
| 4,804,558 | 2/1989 | Saitoh et al. | 427/66 |
| 5,006,365 | 4/1991 | Nire et al. | 427/66 |

OTHER PUBLICATIONS

"Molecular beam epitaxial XnSe:Mn dc electroluminescent cell with very low threshold voltage" J. Appl. Phys. 52(9) Sep. 1981 pp. 5797–5799.

Cattell et al, "Electroluminescent From Films of ZnS:Mn Prepared by Organometallic Chemical Vapor Deposition" IEEE Transaction on Electron Devices, vol. ED-30, No. 5, May 1983, pp. 471–475.

German Patent Abstract 89304862.9, abstract only (no date).

World Patent Index Latest, Derwent File Supplier, Derwent Publication, Ltd., London, GB & JP-A-62 079 285 (Ricoh), abstract only (no dated).

*Primary Examiner*—Janyce Bell

[57] ABSTRACT

A process for preparing an electroluminescent film which comprises causing a substrate held at a high temperature to simultaneous contact two kinds of vapors of (a) Group II element and a Group VI element or a compound thereof, capable of forming a Group II-VI compound semiconductor, and (b) a halide of an element capable of acting as luminescent centers in the Group II-VI compound semiconductor, in the presence of flowing hydrogen or an inert gas, whereby a thin electroluminescent film comprising the Group II-VI compound semiconductor and containing the element forming the luminescent centers is formed on the surface of the substrate.

11 Claims, 6 Drawing Sheets

F I G. 5
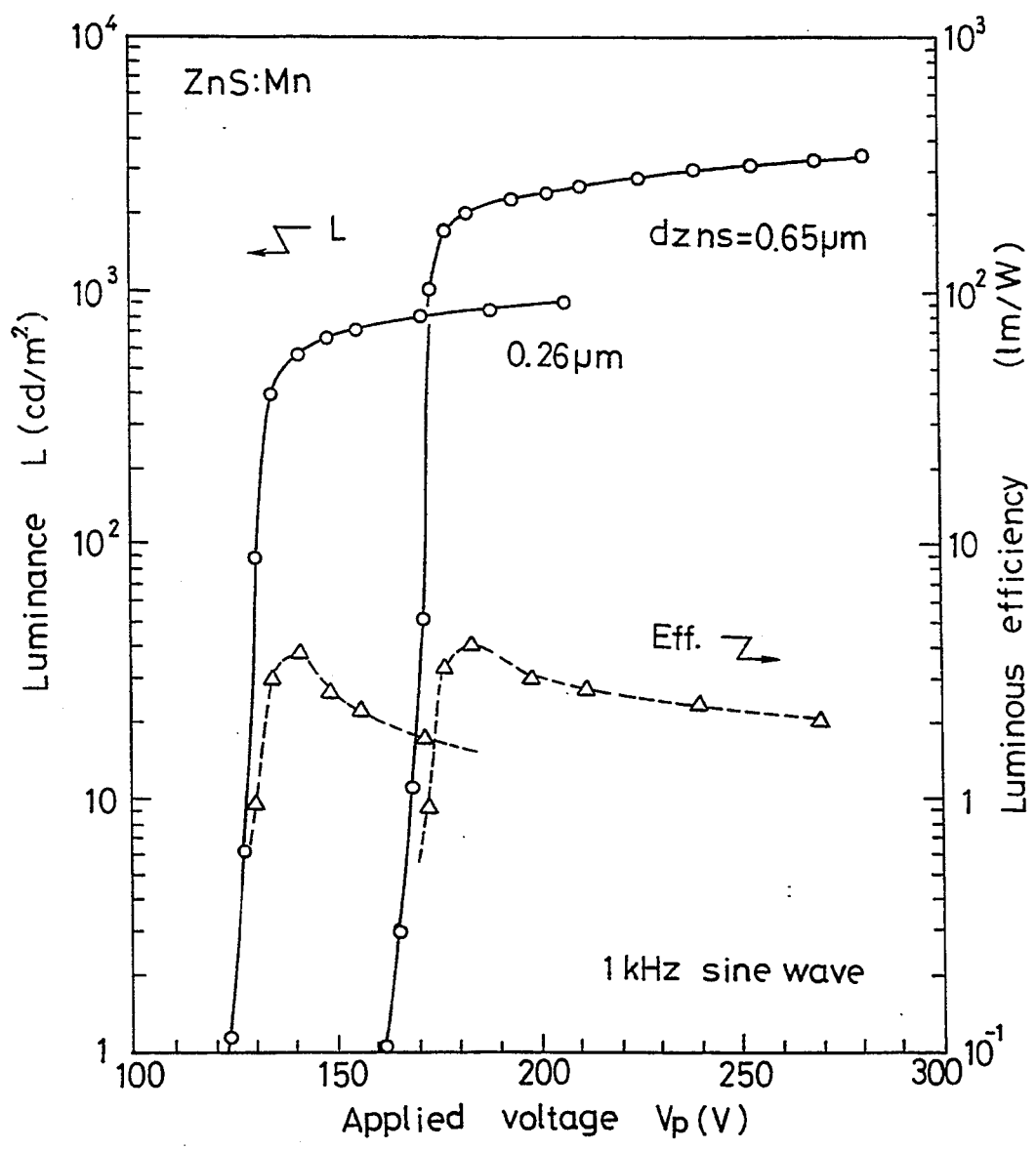

PROCESS FOR PREPARING AN ELECTROLUMINESCENT FILM

This application is a continuation of application Ser. No. 07/348,392 filed on May 8, 1991, now abandoned.

BACKGROUND OF THE INVENTION

1. Field of the Invention

This invention relates to a process for preparing an electroluminescent (EL) film. More particularly, it relates to a process for preparing a thin EL film by employing a chemical vapor deposition (CVD) technique which enables the growth of a thin film of high quality on a mass-production basis. The thin film EL device which is produced by using the process of this invention allows multicolored luminescence with high brightness and is, therefore, applicable to a planar display of high quality for an electronic apparatus, a measuring instrument or the terminal component of a computer, and a planar television as well.

2. Description of the Related Art

There has been known a thin film EL device which comprises an electroluminescent film made of a semiconductor compound of Group II-VI elements, such as ZnS, ZnSe, CaS, SrS or SrSe, and doped with a rare earth element, such as Tb, Sm, Eu or Ce, for forming luminescent centers.

A typical thin film EL device which is practically employed comprises an electroluminescent film made of ZnS and doped with Mn forming luminescent centers, two insulating layers of high resistivity between which the electroluminescent film is sandwiched, a transparent electrode on the outside of one of the insulating layers and a back electrode on the outside of the other insulating layer.

In order to achieve a high degree of luminance and reliability, the electroluminescent film is required to contain a relatively high concentration of Mn in the range of 0.1 to 1 at.% and have a high degree of crystallinity. Two processes are practically used for preparing such an electroluminescent film. One of them is the electron-beam evaporation technique which employs sintered pellets of a mixture of ZnS and Mn. The other process is the atomic layer epitaxy (ALE) in which Zn, Mn and S are transported in vapor form to a substrate alternately to form mono layers of atoms one upon another (Japanese Patent Publication No. 35158/1982).

Attempts have been made to form EL devices by molecular beam epitaxy (MBE) (Tomoyoshi, et al.: "Molecular beam epitaxial ZnSe:Mn dc electroluminescent cell with very low threshold voltage", J. Appl. Phys., 52, September 1981, pp. 5797–5799), and by organometallic chemical vapor deposition (OMCVD) (Alan F. Cattell, et al.: "Electroluminescence Fro Films of ZnS: Mn Prepared by Organometallic Chemical Vapor Deposition", IEE TRANSACTION ON ELECTRON DEVICES, vol. ED-30, No. 5, May 1983). Both of these processes are, however, still in the stage of basic research prior to practical use.

Attempts have also been made to employ hydrogen or halogen transport chemical vapor deposition (CVD) for preparing a thin film of a single-crystal compound semiconductor of Group II-VI elements, such as ZnS, for the purpose of making a light-emitting diode or laser. There is, however, not known any case where this CVD technique has been employed to form an electroluminescent film for a thin film EL device by simultaneously doping an element forming luminescent centers which is a kind of impurity.

The EL device is essentially required to have a thin and highly crystalline electroluminescent film in order to realize a high degree of luminance and a reduction in driving voltage. Moreover, it is desirable to employ a film-forming process which makes it possible to dope the film with a high concentration of Mn in a stable and accurately controllable way.

While the electron beam evaporation technique is a process which allows for high film-forming speed and is suitable for use on a mass-production basis, it can form only a film of low crystallinity, since the three-dimensional growth of the nucleus occurs during the initial stage of film formation. The film is, therefore, required to have a large thickness in order to achieve a high degree of luminance, which necessarily brings about an increase in driving voltage. The low crystallinity is also the cause of a reduction in reliability of the film property.

As the film which has been formed by ALE is a product of the two-dimensional growth, it is of high crystallinity and can, therefore, realize a high degree of luminance and a reduction in driving voltage. This process, however, allows a film to grow only very slowly and is, therefore, not suitable for use on a mass-production basis.

While MBE can also form a film of high crystallinity, it has the drawbacks of being unable to form a film having a large area and lacks applicability on a mass-production basis. The OMCVD process is disadvantageous due to the fact that few kinds of organic materials are available for use as a dopant forming luminescent centers.

SUMMARY OF THE INVENTION

Under these circumstances, it is an object of this invention to provide a process which can prepare an electroluminescent film of high quality, and having a large area, on a mass-production basis.

The present invention has been accomplished based upon the findings that when the vapor of a halide of an element for luminescent centers is supplied to a substrate together with the vapor for forming a Group II-VI compound semiconductor under CVD condition, a thin electroluminescent film of high quality can efficiently be formed on the substrate.

According to the invention, there is provided a process for preparing an electroluminescent film which comprises causing a substrate held at a high temperature to be simultaneously contacted with two kinds of vapors of (a) Group II element and a Group VI element or a compound thereof capable of forming a Group II-VI compound semiconductor compound, and (b) a halide of an element capable of acting as luminescent centers in the Group II-VI semiconductor compound, under the flow of a hydrogen or inert gas, whereby a thin electroluminescent film comprising the Group II-VI compound semiconductor and containing the element forming the luminescent centers is formed on the surface of the substrate.

This invention allows to efficiently produce an electroluminescent film of high crystallinity doped with a high concentration of an element forming luminescent centers. The process of this invention is suitable for the formation of a film having a large area and in the mass production of such a film, as it is based on a chemical vapor deposition technique. The present invention enables the realization of an electroluminescent device which can be driven at a lower voltage than heretofore similar devices to emit light having a high degree of luminance. Therefore, the process of the present invention has a high industrial value as compared with conventional methods.

BRIEF DESCRIPTION OF THE DRAWINGS

FIG. 5 is a graph showing the voltage-luminance characteristics with the luminous efficiency of a thin film EL device made by way of example as will hereinafter be described.

DETAILED DESCRIPTION OF THE INVENTION

Figure 1:
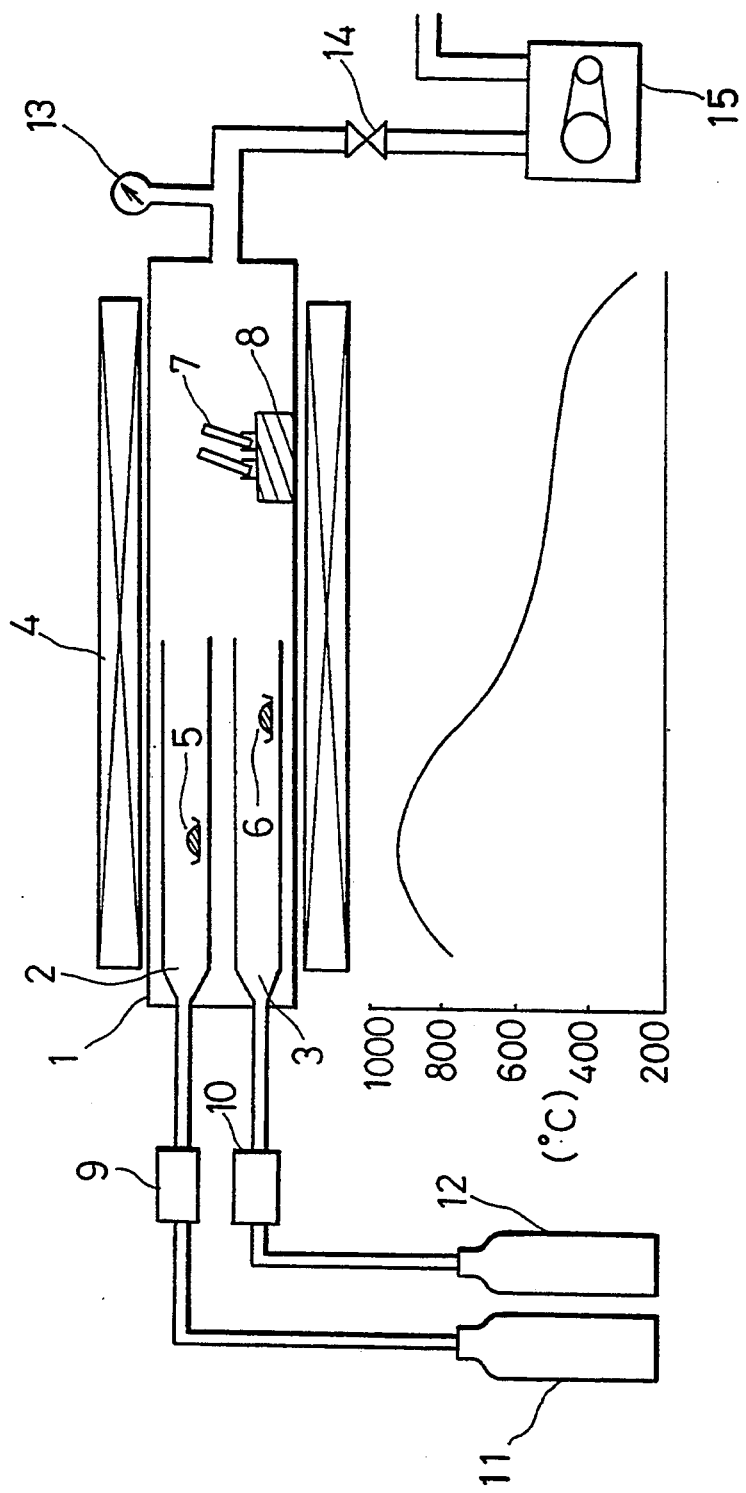
FIG. 1 is a schematic view showing a chemical vapor deposition apparatus employed for carrying out a process of the present invention, together with a graph showing the longitudinal temperature distribution of the reaction chamber which the apparatus includes.

According to the process of the present invention, the substrate on which an electroluminescent film is going to be formed is usually placed in a CVD chamber through which a hydrogen or inert gas as a carrier gas is flowing. When an inert gas is employed, it is possible to use, for example, argon, helium or nitrogen gas.

The substrate is heated to, and held at, an appropriate high temperature at which the growth of a film from a vapor phase takes place. It is suitable to hold the substrate at a temperature of about 400° C. to 600° C.

The growth of the film from a vapor phase is effected by supplying (a) a Group II element and a Group VI element which are capable of forming a Group II-VI compound semiconductor or a compound of compound, these elements, and (b) a halide of an element for forming luminescent centers, both in vapor form, to flow simultaneously into contact with the substrate surface at a high temperature.

The Group II element which is employed may, for example, be Zn, Cd, Ca or Sr and the Group VI element may, for example, be S, Se or O. The resulting compound of these elements may, for example, be ZnS, ZnSe, SrS or CaS. As these elements or compounds are solid at ordinary temperatures, they are vaporized by heating to an appropriate temperature in the presence of the flowing hydrogen or inert gas and the resulting vapor is transported to the substrate. If, for example, ZnS is employed, it is usually heated to a temperature of 800° C. to 1000° C. and the resulting vapor thereof is transported at a speed of from $10^{-5}$ to $10^{-3}$ mol per minute.

The element which is employed for forming luminescent centers may be Mn or a rare earth element, such as Tb, Sm, Eu, Lu or Ce. The halide thereof which is used may, for example, be a fluoride, chloride, bromide or iodide. It is particularly preferred to use a chloride, such as $MnCL_2$, $TbCl_3$ or EuCl. As the halide which is employed is also solid at ordinary temperatures, it is vaporized by heating and its vapor is supplied to the substrate. However, it is alternatively possible to heat Mn or a rare earth element, or a compound thereof other than the halides (e.g. oxide or sulfide) to an appropriate temperature (e.g. 600° C. to 800° C. if Mn is employed), while supplying it with gas of a hydrogen halide, such as hydrogen chloride, thereby producing in situ vapor of the halide of Mn or a rare earth element which is continuously supplied to the substrate with the Group II and VI elements. This method has the advantage of being able to form an electroluminescent film of particularly good quality.

When the halide which is employed is, for example, $MnCl_2$, it is appropriate to transport it at a rate of from $10^{-4}$ to $10^{-6}$ mol per minute.

According to the invention, since all of the elements used to form an electroluminescent film are simultaneously supplied to flow into contact with the substrate surface under the specific conditions as hereinabove described, it is possible to grow thereon an electroluminescent film which comprises a Group II-VI compound semiconductor of high density and crystallinity as a matrix and doped with a high concentration (i.e. 0.1 to 1 at. %) of an element forming luminescent centers. The period of time for effecting the process of the invention is preferably so controlled as to form an electroluminescent film having a thickness of from 0.3 to 1.0 micron which is suitable for a thin film EL device.

Thus, the process of the present invention enables the continuous formation of an electroluminescent film of high crystallinity doped with a high concentration of a luminescent center-forming element in a single step operation by simultaneously effecting the vapor-phase growth of its matrix on the substrate surface and the transportion of a halide of the luminescent center-forming element thereto.

PREFERRED EMBODIMENTS

EXAMPLE 1

Description will now be made of the results which were obtained when a powder of ZnS was heated at a high temperature and the resulting vapor thereof was transported to a deposition zone by hydrogen gas to form a film of ZnS. Similar results to those described hereinbelow were also obtained when argon gas was used instead of hydrogen, and when the individual elements of Zn and S were used instead of the ZnS powder. The apparatus which was employed for carrying out a process embodying this invention is shown in FIG. 1.

The apparatus included a reaction chamber which comprised a main tube 1 of quartz having a length of 1 m and an inside diameter of 5 cm, two vapor supplying tubes 2 and 3 disposed in the main tube 1 and each having a length of 50 cm and an inside diameter of 2 cm, and an electric furnace 4 surrounding the main tube 1. The chamber had a longitudinal temperature distribution as shown graphically in FIG. 1.

A quartz boat containing a powder of ZnS 5 was placed in that portion of the vapor supplying tube 2 which had a temperature of about 930° C., while another quartz boat containing a powder of Mn 6 as a material for forming luminescent centers was positioned in that portion of the tube 3 which had a temperature of about 750° C. Hydrogen gas was supplied from a bottle 11 of hydrogen to the tube 2 at a rate of 100 cc per minute for transporting the resulting vapor of ZnS. When argon gas was employed instead of hydrogen, it was found to enable the growth of a film in a similar way, though it showed an about 10% lower rate of vapor transportation. Hydrogen chloride gas was supplied from a bottle 12 of hydrogen chloride to the tube 3 at a rate of 0.1 to 1.5 cc per minute for forming vapor of manganese chloride as a result of the reaction shown by formula I, and transporting it to the deposition zone:

$$Mn + 2HCl \rightarrow MnCl_2 + H_2 \quad (I)$$

The vapors of ZnS and $MnCl_2$ were transported to the deposition zone in which a glass substrate 7 on which ITO, $SiO_2$ and $Si_3N_4$ films had been formed by radio frequency sputtering was supported on a substrate holder 8 at an inclination to the vertical. The surface of the substrate 7 was left in contact with the vapors for a period of 60 minutes, whereby an electroluminescent film was formed thereon. Then, $Si_3N_4$ and $Al_2O_3$ films were formed on the electroluminescent film by radio frequency sputtering, and an Al film on the $Al_2O_3$ film by vacuum evaporation, whereby an EL device was obtained.

In FIG. 1, 9 and 10 are mass flow controllers, 13 is a pressure gage, 14 is a main valve, and 15 is an oil pump.

Figure 2:
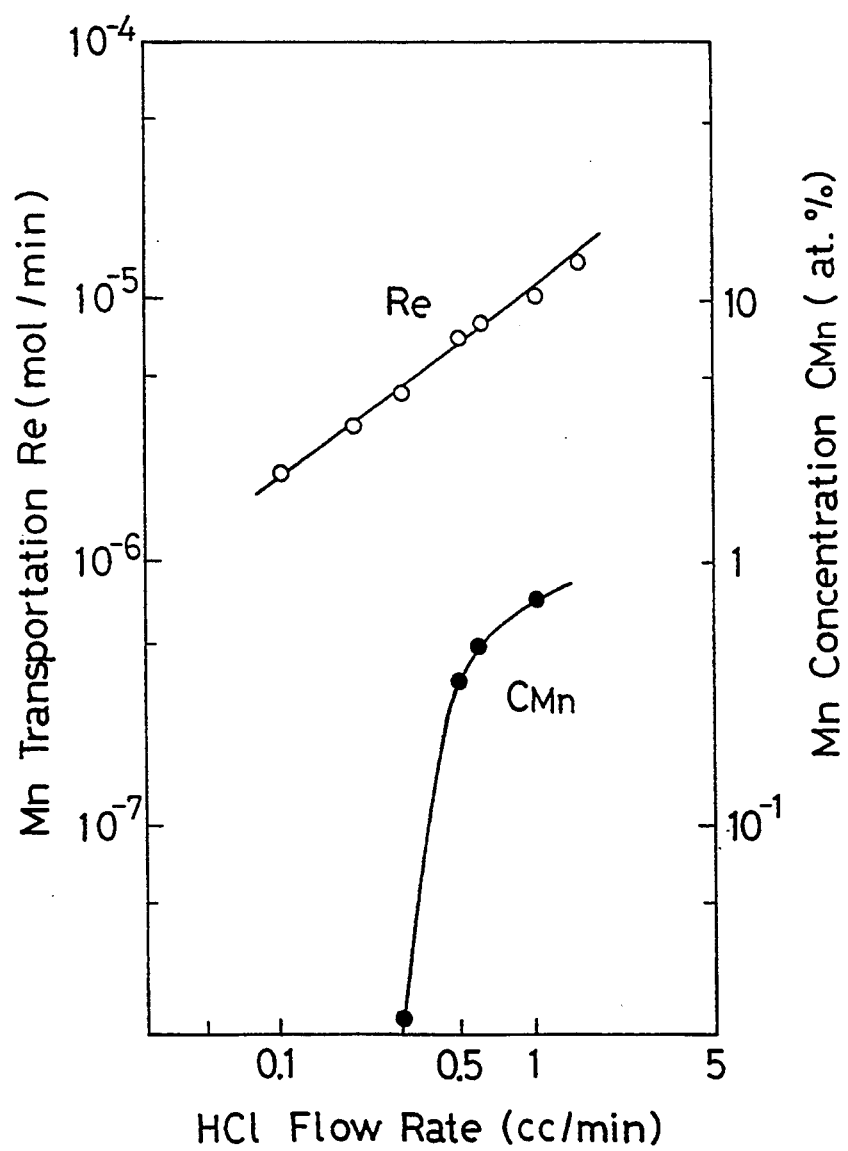
FIG. 2 is a graph showing the rate of Mn transportation and the concentration of Mn in a film of ZnS in relation to the flow rate of HCl gas, based on the results obtained in the examples which will hereinafter be described.

Various electroluminescent films of ZnS were formed by varying the flow rate of HCl gas and employing the same apparatus and conditions as hereinabove described, and then the transportation rate of the produced $MnCl_2$ and the Mn concentration of the ZnS film were examined in relation to the flow rate of HCl gas. The Mn concentration of each film was determined by an electron-beam probe X-ray microanalyzer. The results are shown in FIG. 2. As is obvious from FIG. 2, the reates of Mn transportation were substantially proportional to the flow rates of HCl gas; in other words, Mn could be transported in a well-controlled way as a result of the reaction shown by formula I above. The Mn concentration of the ZnS film showed a sharp increase when the flow rate of HCl gas exceeded 0.3 cc/min., and when the flow rate of HCl gas was from 0.5 to 0.6 cc/min., the films were doped with 0.3 to 0.5 at. % of Mn which is within the known range of the optimum Mn concentration of the ZnS film in an EL device.

Figure 3:
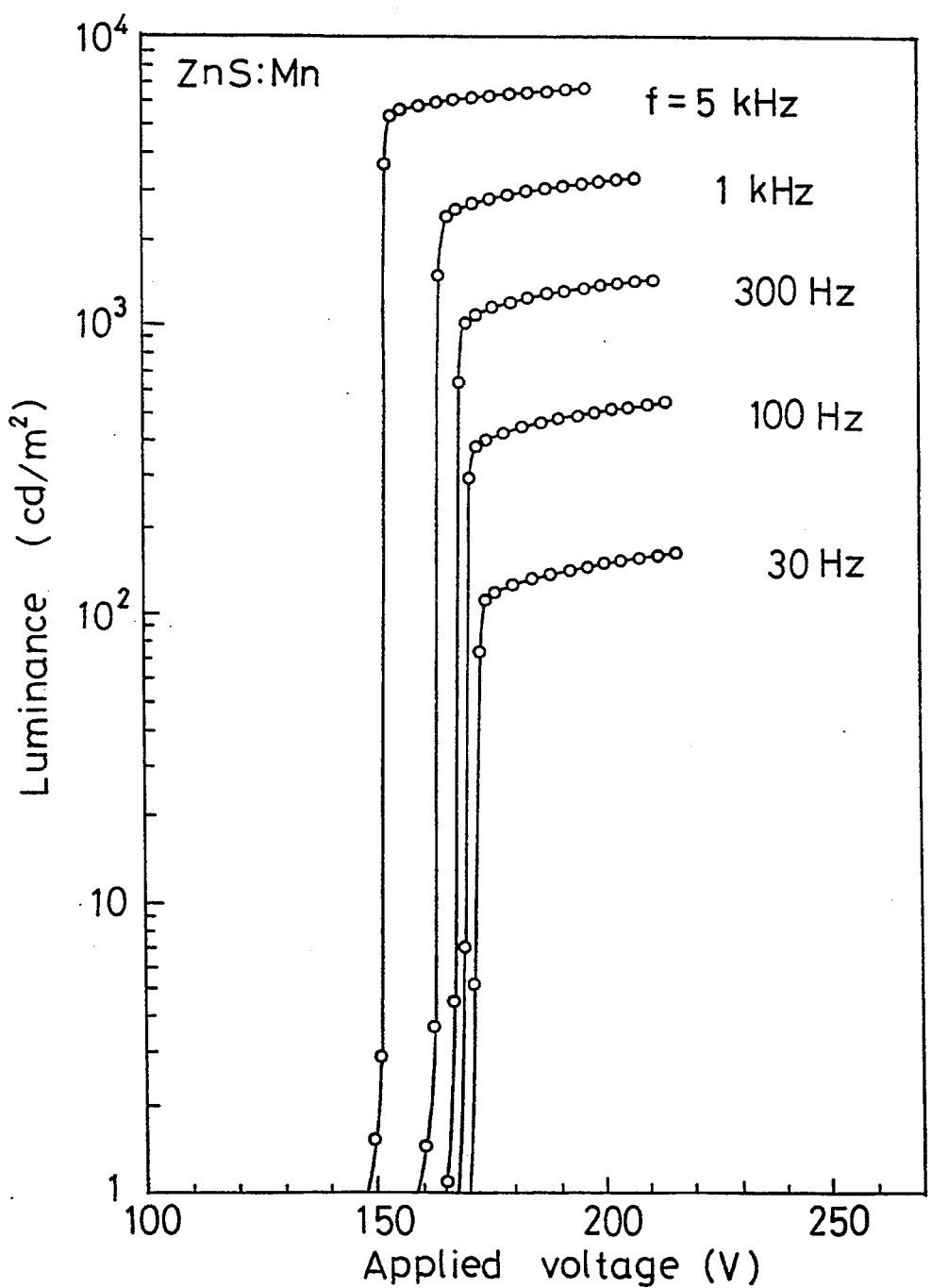
FIG. 3 is a graph showing the voltage-luminance characteristics of a thin film EL device made by way of example as will hereinafter be described.
Figure 4:
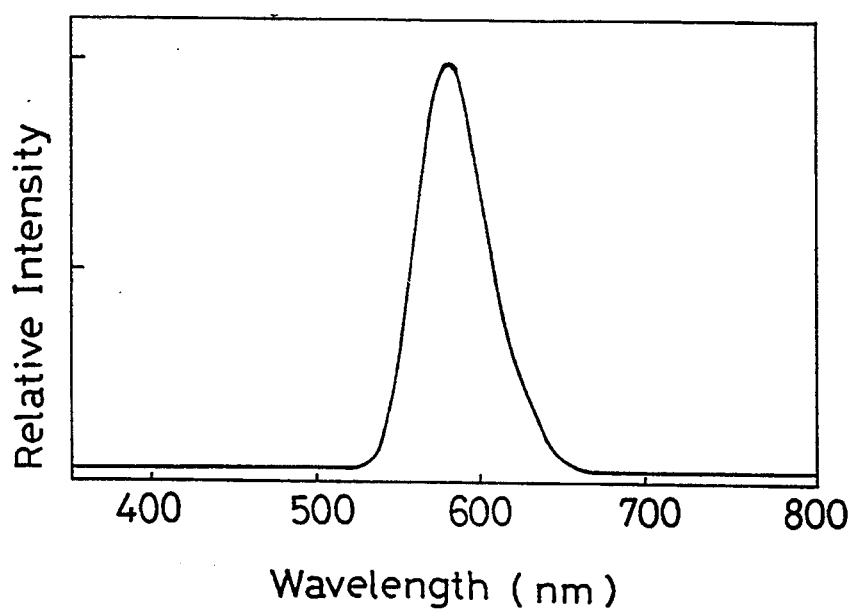
FIG. 4 is a diagram showing the spectrum of luminescence produced by the device of FIG. 3.

An EL device was made by employing the ZnS film containing 0.46 at. % of Mn and having a thickness of 0.65 μm. FIG. 3 shows the voltage-luminance characteristics of the device and FIG. 4 shows the spectrum of the luminescence at a frequency of 1 kHz. As is obvious therefrom, the device emitted light having a yellowish orange color and a wavelength of about 580 nm and when it was driven at a frequency of 1 kHz, it showed a luminance as high as about 3000 cd/m² (876 ft-L) upon application of a low voltage (150–170 V).

FIG. 5 shows the voltage-luminance characteristics with the luminous efficiency of the device using the ZnS film having a thickness of 0.26 μm or 0.65 μm which is prepared by the claimed invention. As is clear therefrom, quite thin ZnS film (0.26 μm) also allows a high luminous efficiency. This fact clearly shows the film being of high quality.

Although Mn has been described as having been employed as the material for forming luminescent centers, it was also possible to employ a compound thereof, such as MnS or MnO, and supply Mn in the form of a halide as a result of the reaction:

$$MnS + 2HCl \rightarrow MnCl_2 + H_2S;$$

or $$MnO + 2HCl \rightarrow MnCl_2 + H_2O$$

It was also possible to employ a hydrogen halide other than HCl, such as HBr, and supply Mn in the form of a halide as a result of the reaction:

$$Mn + 2HBr \rightarrow MnBr_2 + H_2$$

Moreover, it was possible to employ a rare earth element (Lu), such as Tb or Sm, as the material for forming luminescent centers and supply it in the form of a halide as a result of the reaction:

$$2Lu + 6HCl \rightarrow LuCl_3 + 3H_2$$

to dope an electroluminescent film with luminescent centers. When a halide, such as $MnCl_2$ or $TbCl_3$, was used as the material for forming luminescent centers, it was not necessary to use any hydrogen halide gas, but it was sufficient to heat it to supply vapor of the material for forming luminescent centers.

EXAMPLE 2

Figure 6:
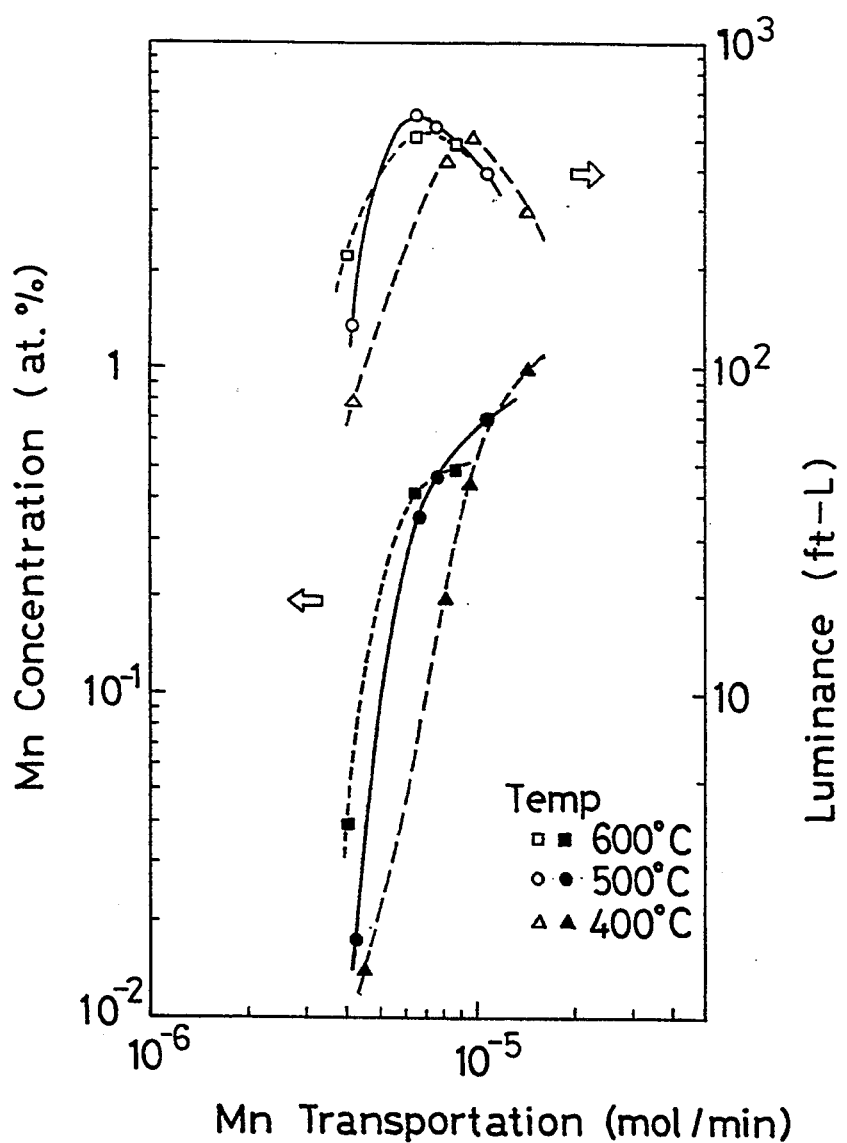
FIG. 6 is a graph showing the concentration of Mn in an electroluminescent film and its luminance in relation to the rate of Mn transportation and the substrate temperature, based on the results obtained in the examples.

Electroluminescent films of ZnS each having a thickness of 0.5 micron were formed on substrates by employing different temperatures for heating the substrates and otherwise following EXAMPLE 1. The Mn concentrations of the films and the luminance obtained by driving at a frequency of 1 kHz were examined in relation to the rates of Mn transportation and substrate temperatures. The results are shown in FIG. 6. As is obvious therefrom, a particularly high concentration of Mn doping was achieved at a Mn ($MnCl_2$) transportation rate over about $5 \times 10^{-6}$ mol/min. and the films having a Mn concentration of about 0.3 to 0.5 at. % showed the highest luminance.

EXAMPLE 3

The process of the invention was performed according to the procedure of EXAMPLE 1 except that a quartz tube having an inside diameter of 250 mm and a glass plate of $170 \times 140$ mm in size were used as a reaction chamber and a substrate, respectively.

Then, the electroluminescent film (Mn doped ZnS film) having a large area was uniformly formed over the substrate. The variation in the concentration of Mn for transverse direction and in the thickness of the film were within a range of ±5% and ±2%, respectively.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What we claimed is:

1. A process for preparing an electroluminescent film comprising the steps of:
   i) providing a substrate held at a high temperature;

ii) providing and heating a Group II element and a Group VI element, or a compound thereof, capable of forming a Group II-VI compound semiconductor to generate a vapor;

iii) providing and heating an element capable of acting as a luminescent center in said Group II-VI compound semiconductor and a hydrogen halide gas to form a vapor of a halide of said element; and iv) providing a hydrogen gas or an inert carrier gas to carry the vapors generated in said steps ii) and iii) onto said substrate;

wherein the heating in said steps ii) and iii) is kept to be higher than the temperature of said substrate in said step i), and said steps i) to iv) are conducted in one reaction chamber which fails to have any barrier between a place to set said substrate and a place to conduct said steps ii) to iv);

whereby a thin electroluminescent film comprising said Group II-VI compound semiconductor containing said element acting as said luminescent center is deposited on a surface of said substrate.

2. The process of claim 1, in which said Group II element is selected from at least one of Zn, Cd, Ca and Sr and said Group VI element is selected from at least one of S, Se and O.

3. The process of claim 1, in which said compound semiconductor of said Group II and Group VI elements is selected from at least one of ZnS, ZnSe, SrS and CaS.

4. The process of claim 1 in which said element capable of acting as luminescent centers in said semiconductor compound is selected from at least one of Mn and a rare earth element.

5. The process of claim 4, in which said rare earth element is selected from at least one of Tb, Sm, Eu, Lu and Ce.

6. The process of claim 1, in which said halide is selected from at least one of a fluoride, chloride, bromide and iodide.

7. The process of claim 1, in which said substrate is held at a temperature of about 400° to 600° C.

8. The process of claim 1, in which said inert gas is selected from at least one of argon, helium and nitrogen gas.

9. The process of claim 1, in which said resulting electroluminescent film has a thickness of about 0.3 to 1 μm.

10. The process of claim 1, in which said resulting electroluminescent film is doped with from 0.1 to 1 at. % of said element forming luminescent centers.

11. The process of claim 1, which is effected in a CVD chamber.

* * * * *